(12) United States Patent
Kitazume et al.

(10) Patent No.: US 8,237,461 B2
(45) Date of Patent: Aug. 7, 2012

(54) CONTACTOR, PROBE CARD, AND METHOD OF MOUNTING CONTACTOR

(75) Inventors: Hidenori Kitazume, Tokyo (JP); Koji Asano, Tokyo (JP)

(73) Assignee: Advantest Corporation, Tokyo (JP)

( * ) Notice: Subject to any disclaimer, the term of this patent is extended or adjusted under 35 U.S.C. 154(b) by 264 days.

(21) Appl. No.: 12/670,247

(22) PCT Filed: Jul. 24, 2007

(86) PCT No.: PCT/JP2007/064490
§ 371 (c)(1),
(2), (4) Date: Jan. 22, 2010

(87) PCT Pub. No.: WO2009/013809
PCT Pub. Date: Jan. 29, 2009

(65) Prior Publication Data
US 2010/0194420 A1 Aug. 5, 2010

(51) Int. Cl.
*G01R 31/00* (2006.01)
(52) U.S. Cl. ......... 324/756.03; 324/754.07; 324/755.01; 29/884; 29/842
(58) Field of Classification Search .............. 324/755.07
See application file for complete search history.

(56) References Cited

U.S. PATENT DOCUMENTS

| | | | | | |
|---|---|---|---|---|---|
| 4,382,228 | A | * | 5/1983 | Evans | 324/755.07 |
| 5,621,333 | A | * | 4/1997 | Long et al. | 324/750.16 |
| 5,836,071 | A | * | 11/1998 | Falcone et al. | 29/593 |
| 6,274,822 | B1 | * | 8/2001 | Light et al. | 174/260 |
| 7,063,981 | B2 | * | 6/2006 | Bondestram et al. | 436/34 |
| 7,316,065 | B2 | * | 1/2008 | Lee et al. | 29/884 |
| 7,602,200 | B2 | * | 10/2009 | Miyagi et al. | 324/750.16 |
| 7,924,038 | B2 | * | 4/2011 | Kuniyoshi et al. | 324/755.01 |
| 2006/0066334 | A1 | * | 3/2006 | Martin et al. | 324/758 |
| 2007/0013390 | A1 | | 1/2007 | Kuitani et al. | |
| 2011/0291685 | A1 | * | 12/2011 | Mori | 324/755.01 |

FOREIGN PATENT DOCUMENTS

| | | |
|---|---|---|
| JP | 11-258269 | 9/1999 |
| JP | 2000-249722 | 9/2000 |
| JP | 2001-159642 | 6/2001 |
| WO | 03/071289 | 8/2003 |
| WO | 2007/000799 | 1/2007 |

OTHER PUBLICATIONS

Taiwan Office Action in corresponding Taiwan Application No. 097126768 (10120007230), dated Jan. 4, 2012.
International Search Report in corresponding PCT/JP/2007/064490, English and Japanese versions, mailed Sep. 11, 2007.
International Preliminary Report on Patentability in corresponding PCT/JP/2007/064490, English and Japanese versions, dated Feb. 9, 2010.

* cited by examiner

*Primary Examiner* — Richard Isla Rodas
(74) *Attorney, Agent, or Firm* — Greenblum & Bernstein, P.L.C.

(57) ABSTRACT

A contactor includes conductive parts for electrical connection with input/output terminals of an IC device; beam parts with the conductive part provided on their main surfaces; and a base part supporting the beam parts in a cantilever manner, the base part has a support region supporting the beam parts and mark formation regions at which first positioning marks are provided, and weakened parts relatively weaker in strength than other parts of the base part are provided between the support region and mark formation regions.

9 Claims, 23 Drawing Sheets

CONTACTOR, PROBE CARD, AND METHOD OF MOUNTING CONTACTOR

TECHNICAL FIELD

The present invention relates to a contactor for electrically contacting input/output terminals of an IC device for establishing electrical connection between an IC device and an electronic device test system when testing a semiconductor integrated circuit device or other electronic device (hereinafter also representatively referred to as an "IC device"), a probe card with the same, and a method of mounting the contactor.

BACKGROUND ART

A large number of IC devices are built into a silicon wafer or other semiconductor wafer, then processed by dicing, bonding, packaging, and other steps to form completed electronic devices. These IC devices are tested for operation before shipment. The IC devices are tested in the wafer state or the completed product state.

When testing an IC device in the wafer state, as the contactor for establishing electrical connection between the IC device and an electronic device test system, one (hereinafter also simply referred to as a "silicon finger contactor") made using the MEMS (Micro Electro Mechanical System) process has been known in the past (for example, see Patent Citations 1 to 3). This silicon finger contactor comprises: conductive parts for electrical connection with input/output terminals of the IC device; beam parts with the conductive parts on their main surfaces; and a base part supporting the beam parts in a cantilever manner.

Such a silicon finger contactor is provided with positioning marks at the base part. Based on the positioning marks, the contactor is positioned on the board of the probe card for mounting. The positioning marks are provided on regions positioned at the both ends of the base part (hereinafter simply referred to as "mark formation regions"). These mark formation regions are regions dedicated to formation of the positioning marks and cannot support beam parts. For this reason, when arranging a plurality of silicon finger contactors adjoining each other on a board, there was the problem of a drop in the mounting density of the beam parts.

Patent Citation 1: Japanese Patent Publication (A) No. 2000-249722,
Patent Citation 2: Japanese Patent Publication (A) No. 2001-159642
Patent Citation 3: WO03/071289

DISCLOSURE OF INVENTION

Technical Problem

The problem to be solved by the present invention is to provide a contactor able to raise the mounting density of beam parts on a probe card, a probe card with the same, and a method of mounting the contactor.

Technical Solution (1) To achieve the above object, according to a first aspect of the present invention, there is provided a contactor for contacting an input/output terminal of a device under test for establishing electrical connection between the device under test and an electronic device test system when testing the device under test, the contactor comprising: a conductor part for electrical connection with the input/output terminal of the device under test; a beam part with the conductive part provided on its main surface; and a base part supporting the beam part in a cantilever manner, wherein the base part has: a support region supporting the beam part; and a mark formation region where a first positioning mark is provided, and a weakened part relatively weaker in strength than other parts of the base part is provided between the support region and the mark formation region.

While the present invention is not particularly limited to this, preferably the weakened part includes a notch, a groove, or a plurality of through holes provided between the support region and the mark formation region.

While the present invention is not particularly limited to this, preferably the mark formation region is relatively thinner than the support region in the base part.

While the present invention is not particularly limited to this, preferably the base part supports a plurality of the beam parts aligned substantially in parallel all together, and the mark formation regions are arranged at both ends of the support region in the base part along a direction of arrangement of the plurality of beam parts.

While the present invention is not particularly limited to this, preferably the weakened part is provided along a direction substantially perpendicular to the direction of arrangement of the plurality of beam parts.

(2) To achieve the above object, according to a second aspect of the present invention, there is provided a probe card for establishing electrical connection between a device under test and an electronic device test system when testing the device under test, the probe card comprising: any one of the above contactors; and a board on which the contactor is mounted, wherein the mark formation region is cut off from the base part along the weakened part.

(3) To achieve the above object, according to a third aspect of the present invention, there is provided a method of mounting of any of the above contactors, the method of mounting of the contactor comprising: a mounting step of mounting the contactor on the board; and a cutoff step of cutting off the mark formation region from the base part.

While the present invention is not particularly limited to this, preferably the mark formation region is pushed or pulled at the cutoff step so as to cut off the mark formation region from the base part.

While the present invention is not particularly limited to this, preferably the mounting step includes: a positioning step of positioning the contactor relative to the board on the basis of a second mark formed on the board and the first mark formed on the mark formation region; and a fastening step of fastening the conductor to the board.

While the present invention is not particularly limited to this, preferably the method further comprising a step of etching a silicon layer of the base part by a DRIE (deep reactive ion etching) method so as to form the weakened part on the contactor.

ADVANTAGEOUS EFFECTS OF INVENTION

In the present invention, it is possible to cut off the mark formation regions along the weakened parts after mounting a contactor on a board, so it is possible to improve the mounting density of beam parts on a probe card.

Figure 1:
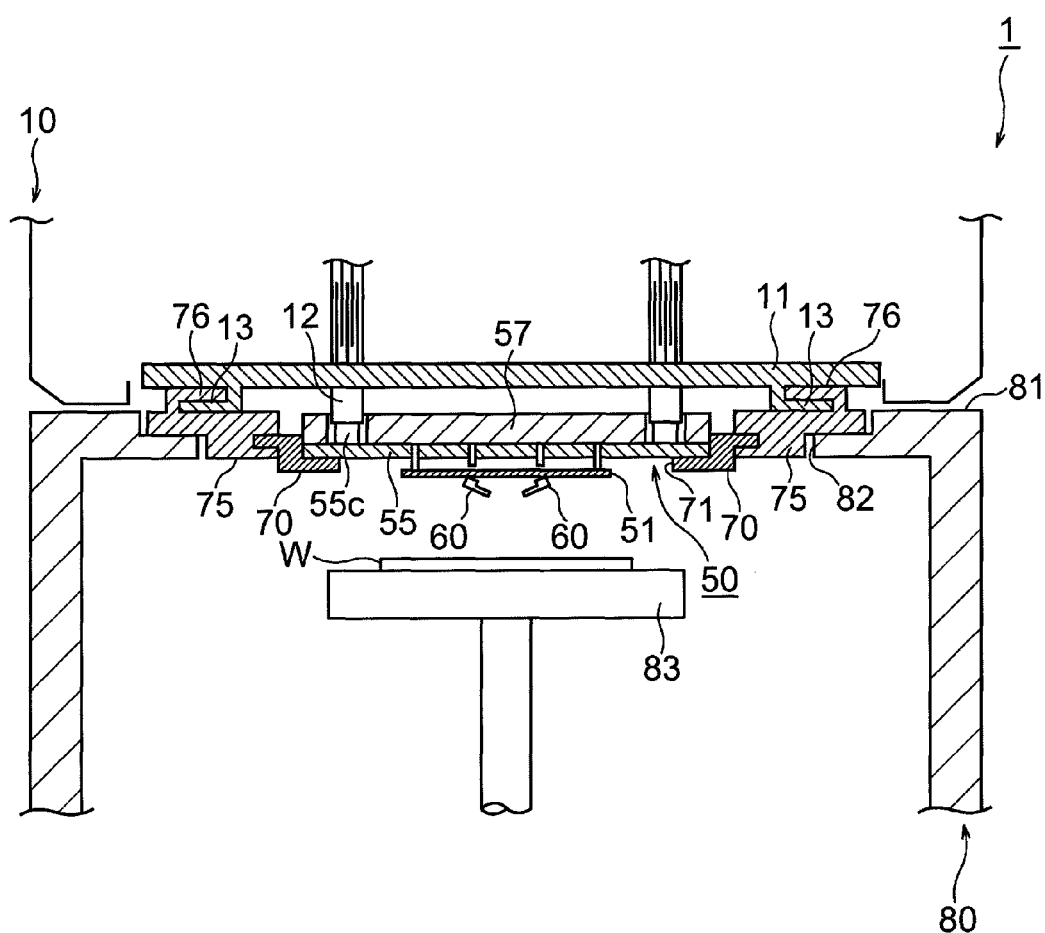
FIG. 1 is a schematic cross-sectional view showing the configuration of an electronic device test system in a first embodiment of the present invention.

EXPLANATION OF REFERENCES 1 electronic device test system
10 test head
11 HIFIX
50 probe card
51 mount base
51c the second mark
51d mounting position
52 bonding wire
53 support column
54 limiter
55 circuit board
56 base member
57 stiffener
60 silicon finger contactor
61 base part
611 support region
612 mark formation region
613 first mark
614 to 618 weakened part
614a to 617a notch
614b to 617b through hole
618a groove
615 weakened part
62 beam part
63 conductive layer

BEST MODE FOR CARRYING OUT THE INVENTION

Below, embodiments of the present invention will be explained based on the drawings.

Figure 2:
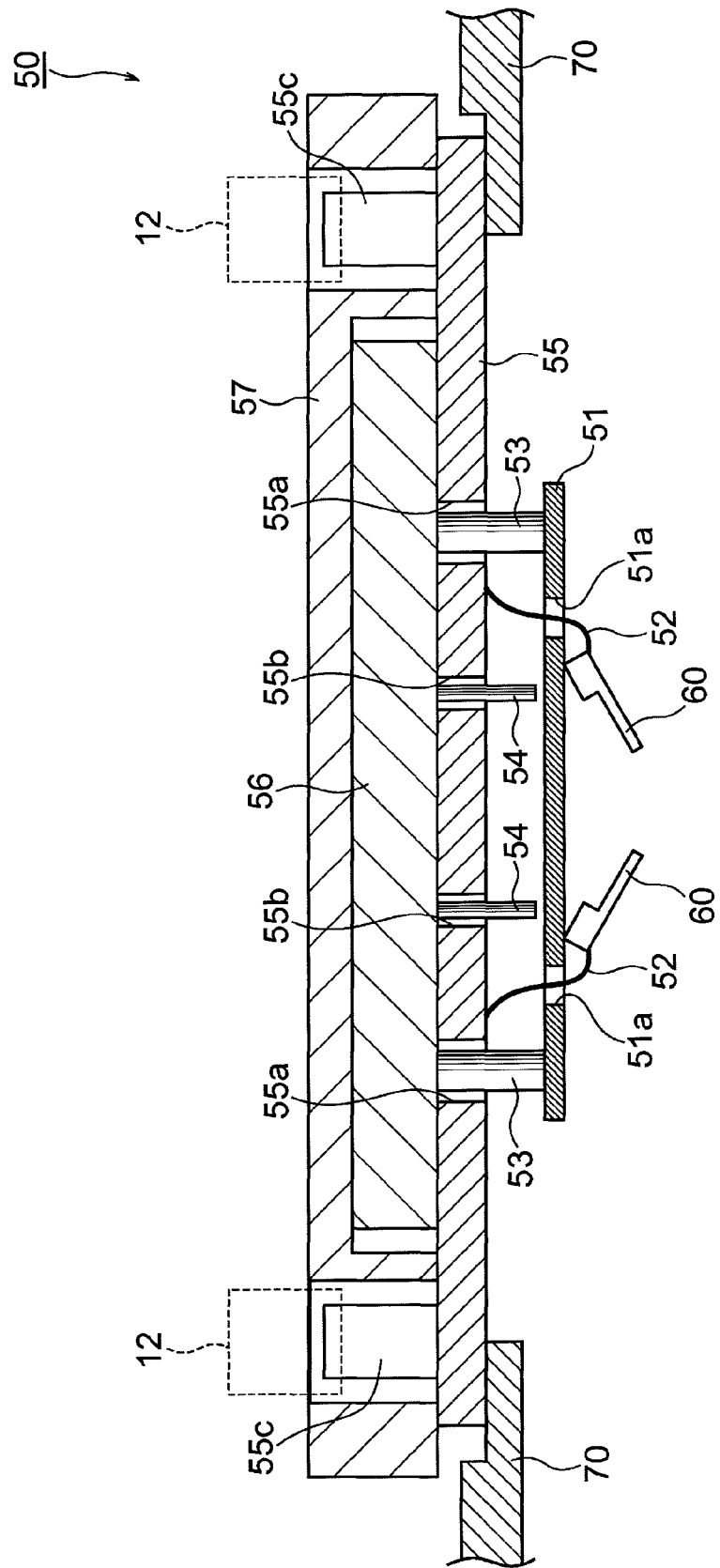
FIG. 2 is a cross-sectional view showing a probe card in a first embodiment of the present invention.
Figure 3:
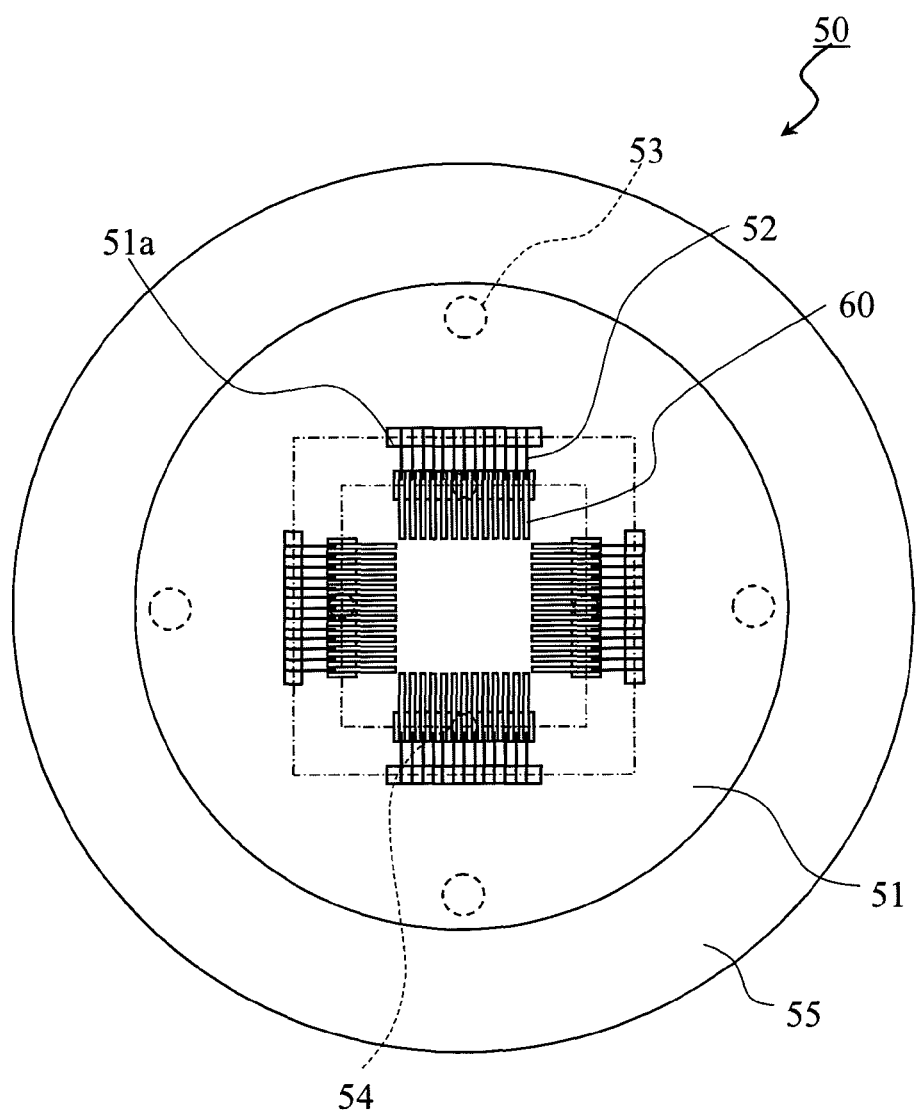
FIG. 3 is a bottom view of the probe card shown in FIG. 2.
Figure 4:
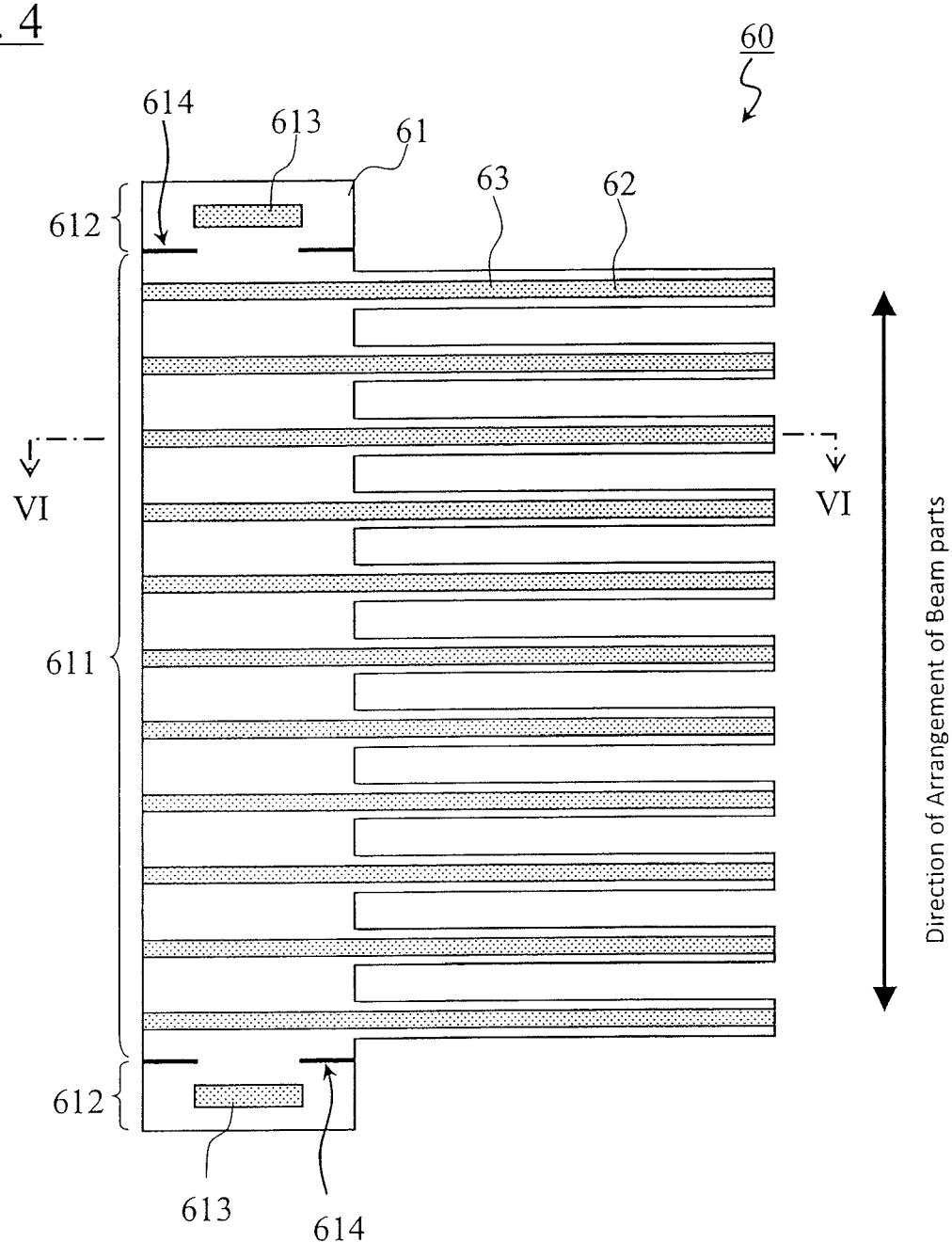
FIG. 4 is a plan view showing a silicon finger contactor in a first embodiment of the present invention.
Figure 5:
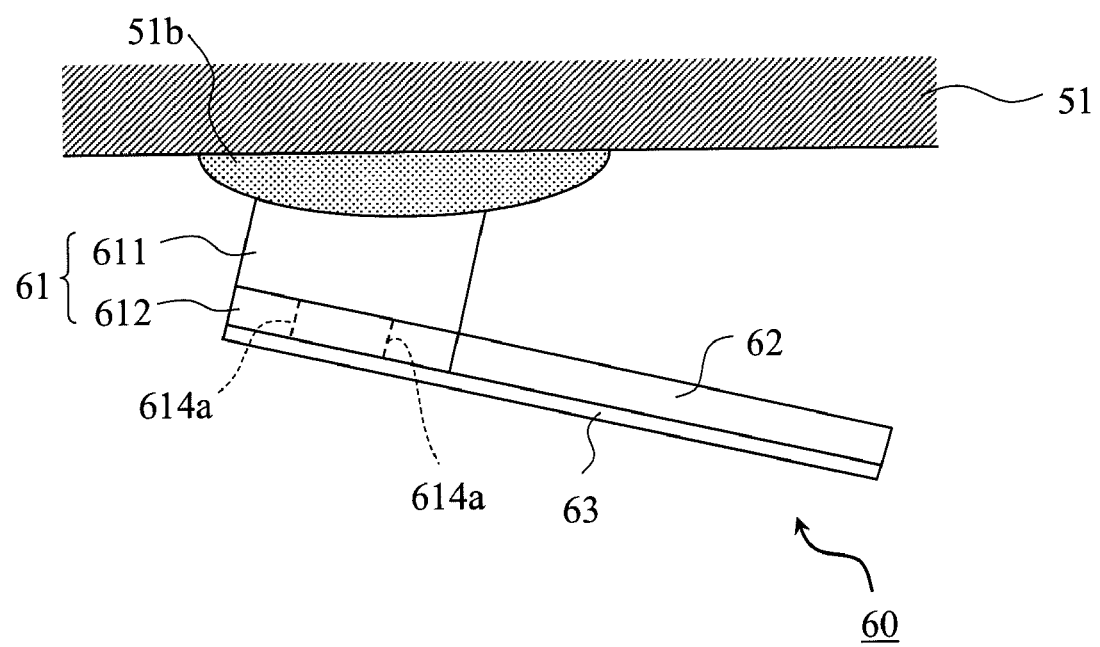
FIG. 5 is a side view of the silicon finger contactor shown in FIG. 4.
Figure 6:
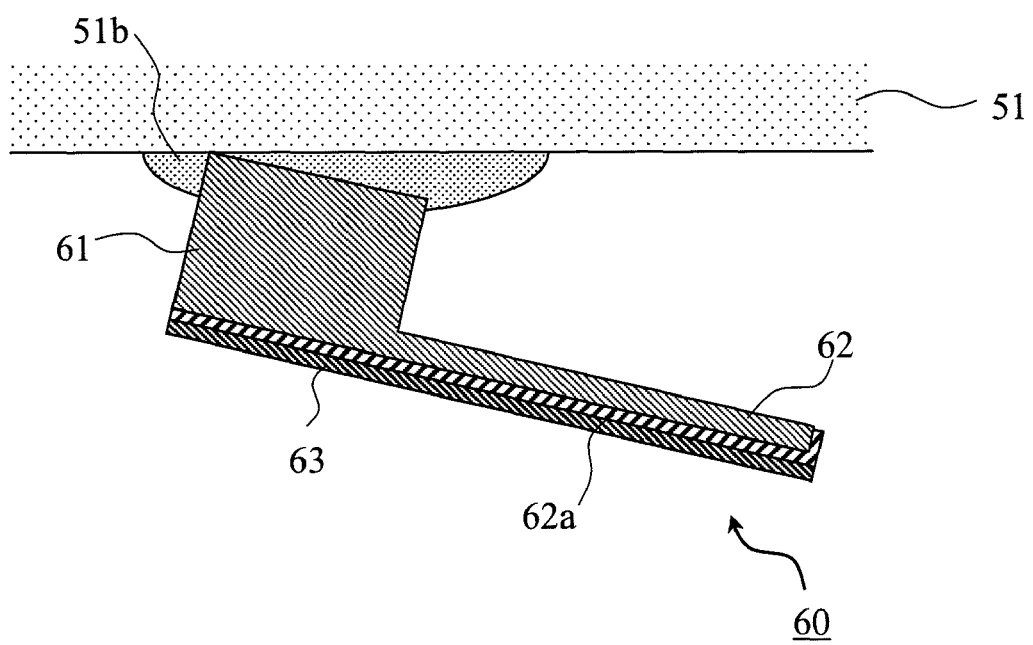
FIG. 6 is a cross-sectional view along the line VI-VI of FIG. 4.
Figure 7:
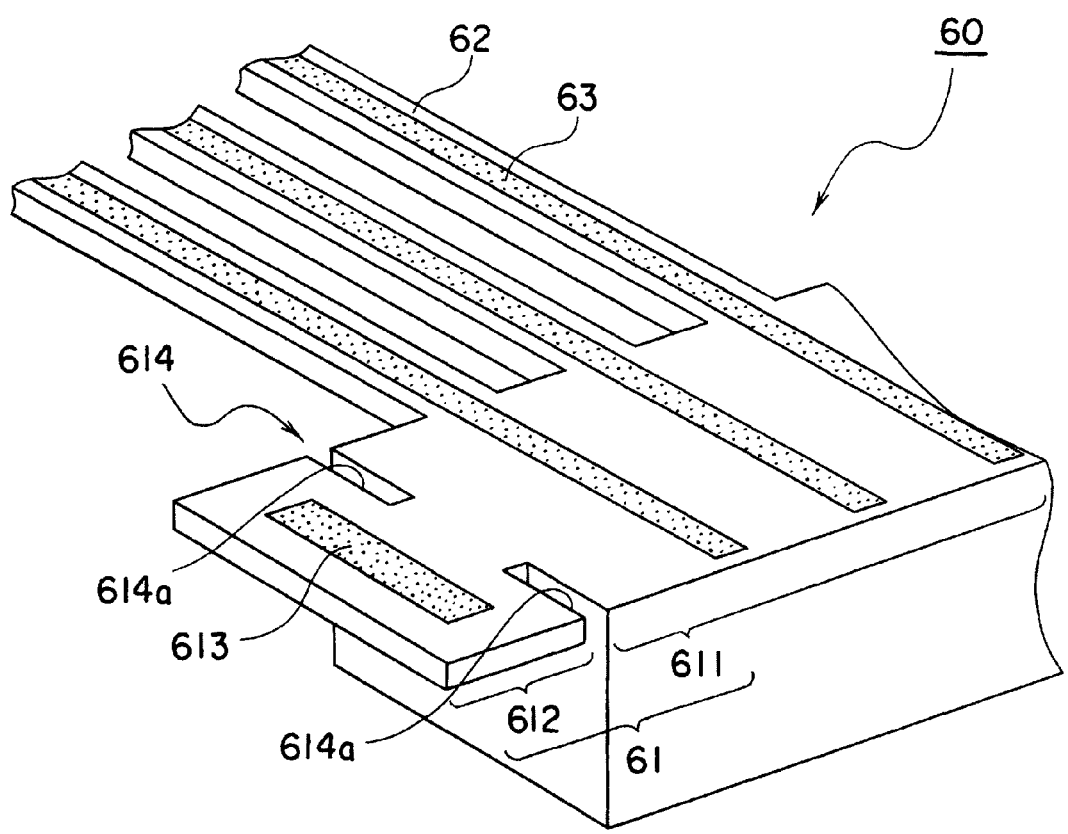
FIG. 7 is a perspective view showing an end of the silicon finger contactor shown in FIG. 4.
Figure 8A:
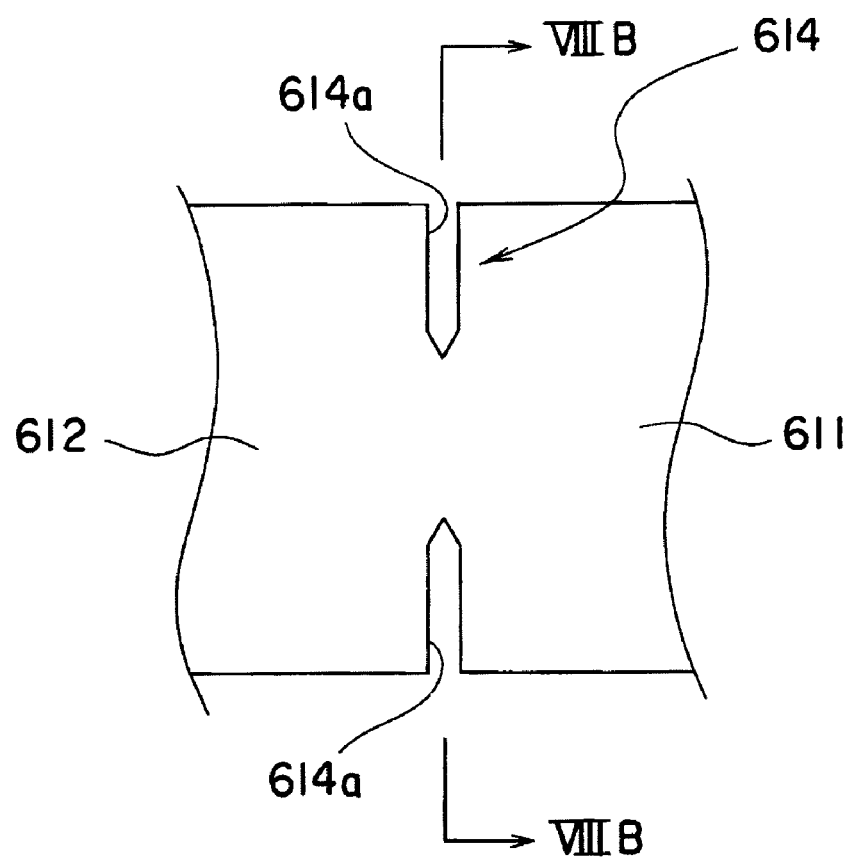
FIG. 8A is a plan view showing a weakened part of a silicon finger contactor in a first embodiment of the present invention.
Figure 8B:
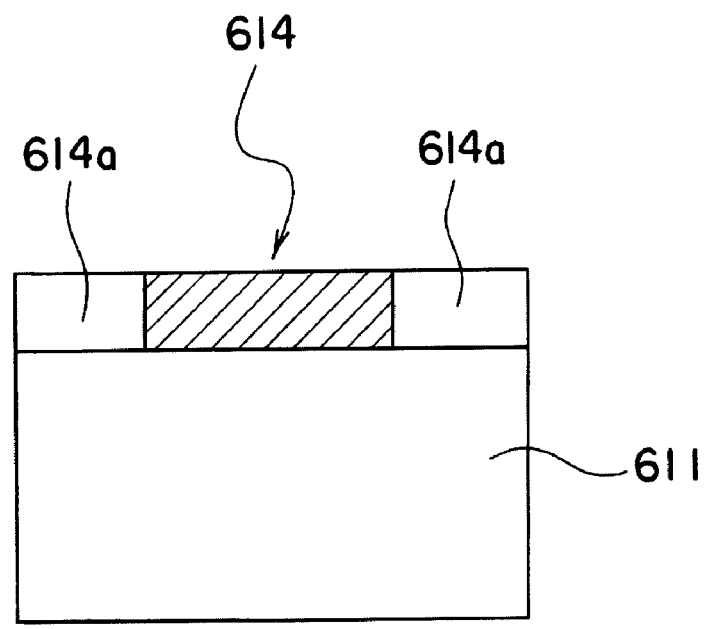
FIG. 8B is a cross-sectional view along the line VIIIB-VIIIB of FIG. 7A.

FIG. 1 is a schematic cross-sectional view showing the configuration of an electronic device test system in a first embodiment of the present invention, FIG. 2 and FIG. 3 are a cross-sectional view and plan view of a probe card in a first embodiment of the present invention, FIG. 4 and FIG. 5 are a plan view and side view of a silicon finger contactor in a first embodiment of the present invention, FIG. 6 is a cross-sectional view along the line VI-VI of FIG. 4, FIG. 7 is a perspective view showing an end of a silicon finger contactor shown in FIG. 4, FIG. 8A is a plan view showing a weakened part of a silicon finger contactor shown in FIG. 4, and FIG. 8B is a cross-sectional view along the line VIIIB-VIIIB of FIG. 8A.

The electronic device test system 1 in the first embodiment of the present invention is a system for testing the electrical characteristics of an IC device built in a semiconductor wafer W composed of for example silicon (Si) etc. This electronic device test system 1, as shown in FIG. 1, comprises: a test head 10 electrically connected via cables to a tester (not shown) for testing an IC device; a probe card 50 for electrically connecting an IC device on the semiconductor wafer W and the test head 10; and a prober 80 for pushing the semiconductor wafer W against the probe card 50.

The probe card 50, as shown in FIG. 1 to FIG. 3, comprises: a large number of silicon finger contactors 60 for electrical contact with input/output terminals of an IC device built in a semiconductor wafer W; a mount base 51 on which the silicon finger contactors 60 are mounted; a circuit board 55 having interconnect patterns (not shown) electrically connected to the silicon finger contactors 60 through bonding wires 52; a base part 56 and stiffener 57 for reinforcing the probe card 50; support columns 53 for supporting the mount base 51; and limiters 54 for suppressing deformation of the mount base 51, and it is connected to the test head 10 via the HIFIX 11.

Each silicon finger contactor 60, as shown in FIG. 4 to FIG. 6, comprises: a base part 61 fastened to the mount base 51; beam parts 52 with back end sides provided at the base part 61 and with front end sides sticking out from the base part 61; and conductive parts 63 formed on the front surfaces of the beam parts 52.

The base part 61, as shown in FIG. 4, has a support region 611 supporting a plurality of (in the present example, 11) beam parts 62 all together in a cantilever manner. The plurality of beam parts 62 are arranged aligned substantially in parallel along the longitudinal direction and stick out from the base part 61 toward the tip direction in finger shapes (comb tooth shapes). Note that, in the present invention, the number of beam parts 62 provided at the base part 61 may be freely set.

Further, the base part 61 has mark formation regions 612 at the both ends of the support region 611 along the direction of arrangement of the beam parts 62 and the mark formation regions 612 are provided with first marks 613. The mark formation regions 612, as shown in FIG. 5 and FIG. 7, are thinner than the support region 611 thereby enabling the mark formation regions 612 to be easily cut off from the base part 61. Incidentally, the mark formation regions 612 cannot support the beam parts 62, so are regions not contributing to improvement of the mounting density of beam parts 62 on the probe card 50.

The first marks 613 provided in the mark formation regions 612 are alignment marks used when mounting the silicon finger contactor 60 on the mount base 51. The first marks 613, for example, comprises plating layers composed of NiCo etc. or through holes.

Further, in the present embodiment, as shown in FIG. 4 and FIG. 7, a weakened part 614 is provided between the support region 611 and each mark formation region 61 in the base part 61. As shown in FIG. 8A and FIG. 8B, the weakened part 614 in this embodiment comprises notches 614a provided at the top and bottom locations between the support region 611 and the mark formation region 612 in the figure, so the part becomes relatively weaker in strength than other parts of the base part 61.

For reducing the size of the contactor, the base part 61 and beam part 62 is formed by applying photolithography or other semiconductor production technology (MEMS process) to a silicon wafer. For this reason, the base part 61 has a silicon layer of monocrystalline silicon, but the above-mentioned weakened part 614 is formed by etching that silicon layer by DRIE (deep reactive ion etching) when forming the base part 61 in the silicon wafer.

The beam parts 62 have insulating layers 62a at their top parts, and insulating layers 62a electrically insulate the conductive parts 63 from other parts in the silicon finger contactor 60. These insulating layers 62a, for example, are composed of an $SiO_2$ layer or a boron doped layer.

The conductive parts 63 are formed on the top surfaces of the insulating layers 62a of the beam parts 62. As the material forming the conductive parts 63, for example, tungsten, palladium, rhodium, platinum, ruthenium, iridium, nickel, or another metal material may be mentioned. As the method for forming the conductive parts 63, for example plating etc. may be mentioned.

Note that, the weakened part of a silicon finger contactor is not particularly limited in shape so long as it becomes relatively weaker in strength than other parts of the base part. It may also be made the shapes of the second to fifth embodiments explained below.

Figure 9A:
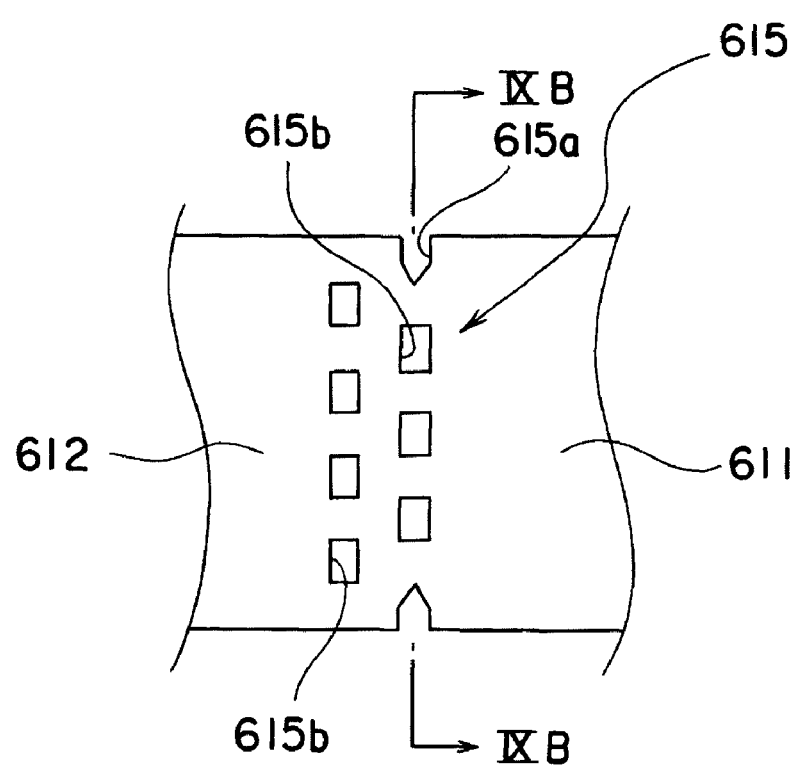
FIG. 9A is a plan view showing a weakened part of a silicon finger contactor in a second embodiment of the present invention.
Figure 9B:
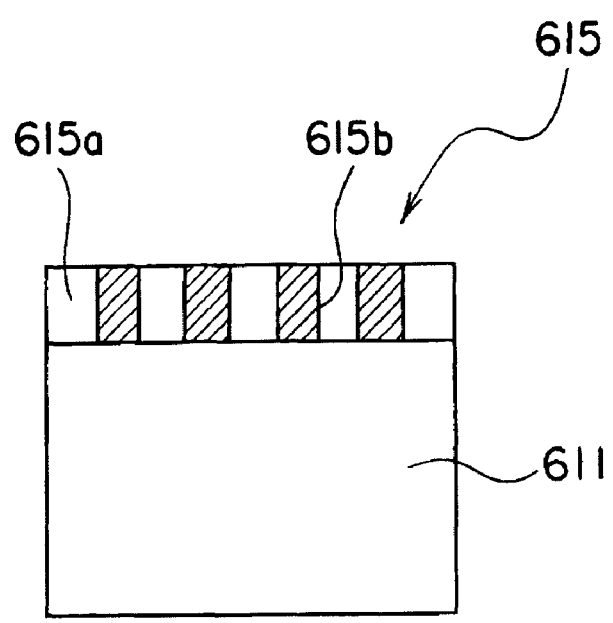
FIG. 9B is a cross-sectional view along the line IXB-IXB of FIG. 9A.

FIG. 9A and FIG. 9B are a plan view and cross-sectional view showing a weakened part in a second embodiment of the present invention. The weakened part 615 in the second embodiment of the present invention, as shown in FIG. 9A and FIG. 9B, comprises notches 615a and through holes 615b. The notches 615a are formed at the top and bottom locations between the support region 611 and the mark formation region 612 in the figure. Further, seven through holes 615b compose two line groups of through holes. The notches 615a are formed on the same line as one group of through holes. The through holes 615b have rectangular cross-sectional shapes. The weakened part 615 in the present embodiment comprises these notches 615a and through holes 615b, so becomes relatively weaker in strength compared with other parts in the base part 61.

Figure 10:
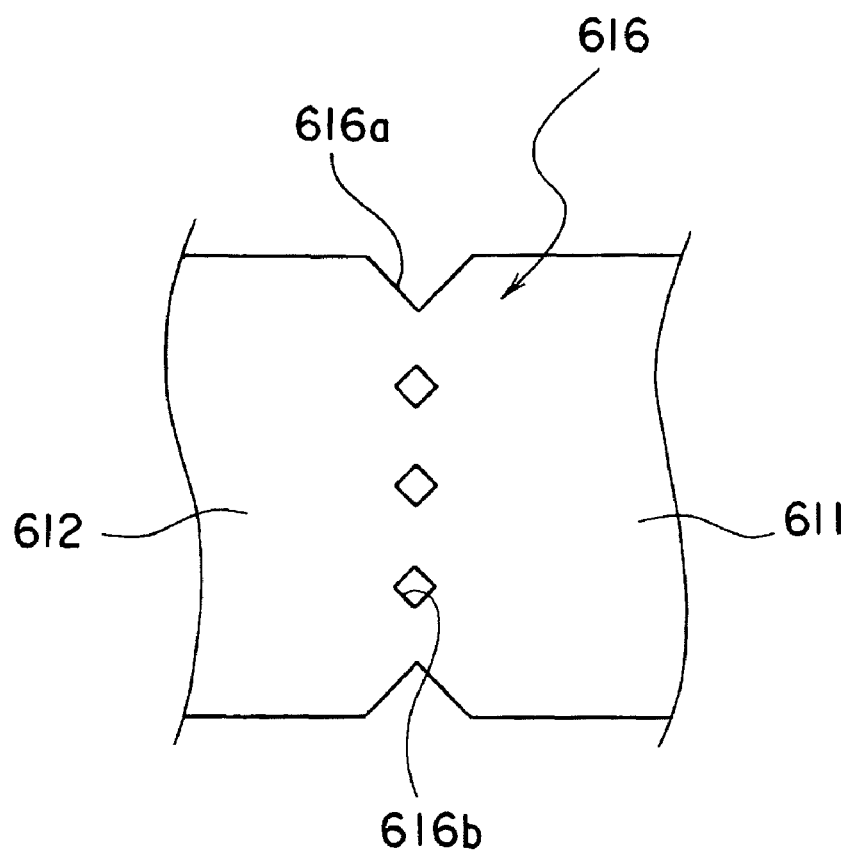
FIG. 10 is a plan view showing a weakened part of a silicon finger contactor in a third embodiment of the present invention.

FIG. 10 is a plan view showing a weakened part in a third embodiment of the present invention. The weakened part 616 in the third embodiment of the present invention, as shown in FIG. 10, also comprises notches 616a and through holes 616b. The notches 616a are formed at the top and bottom two locations between the support region 611 and the mark formation region 612 in the figure. Further three through holes 616b are formed on the same line between these notches 616a. The through holes 616b have diamond cross-sectional shapes. The weakened part 616 in the present embodiment comprises these notches 616a and through holes 616b, so becomes relatively weaker in strength compared with other parts in the base part 61.

Figure 11:
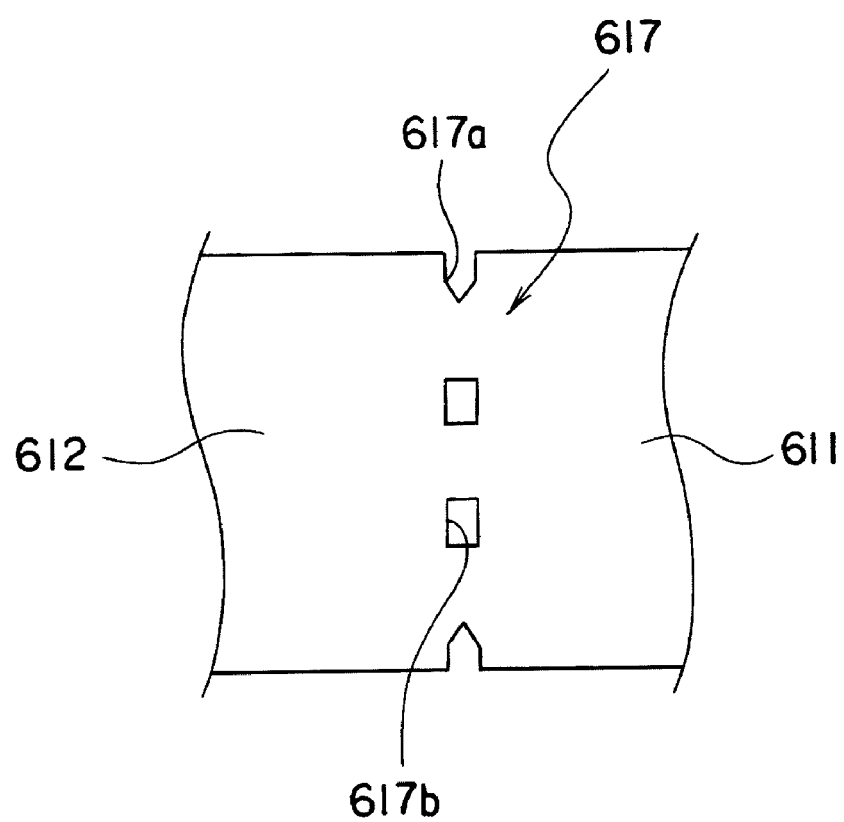
FIG. 11 is a plan view showing a weakened part of a silicon finger contactor in a fourth embodiment of the present invention.

FIG. 11 is a plan view showing a weakened part in a fourth embodiment of the present invention. The weakened part 617 in the fourth embodiment of the present invention, as shown in FIG. 11, also comprises notches 617a and through holes 617b. The notches 617a are formed at the top and bottom two locations between the support region 611 and the mark formation region 612 in the figure. Further two through holes 617a are formed on the same line between these notches 617a. The through holes 616b have rectangular cross-sectional shapes. The weakened part 617 in this embodiment comprises these notches 617a and through holes 617b, so becomes relatively weaker in strength compared with other parts of the base part 61.

Figure 12A:
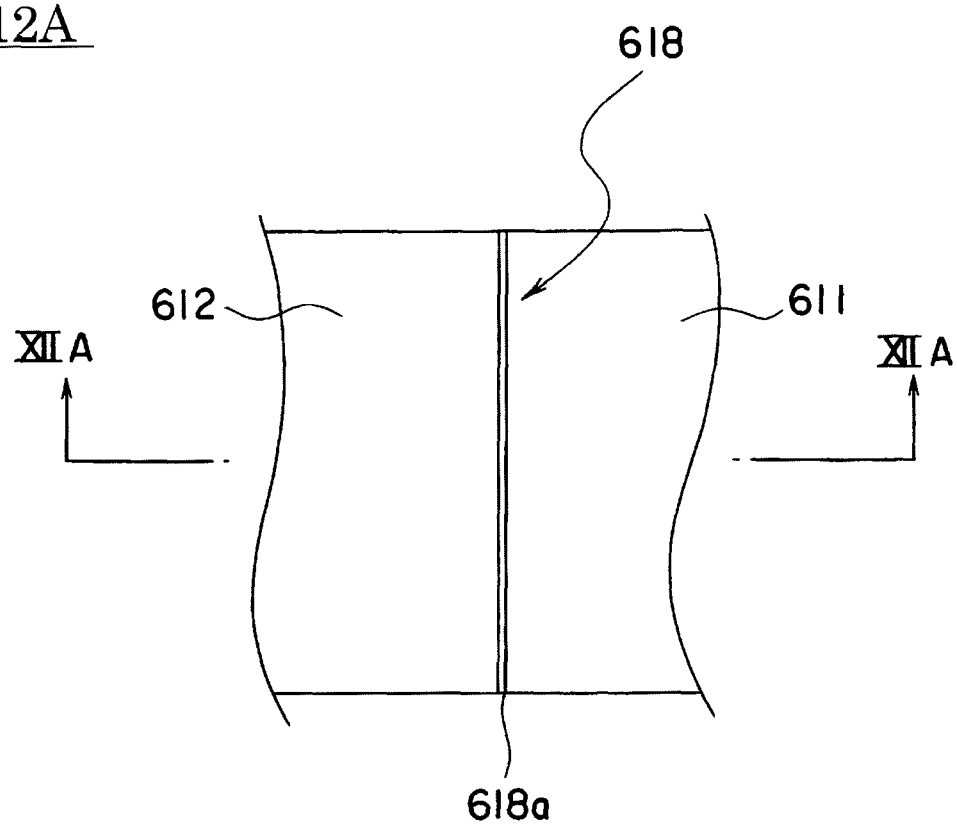
FIG. 12A is a plan view showing a weakened part of a silicon finger contactor in a fifth embodiment of the present invention.
Figure 12B:
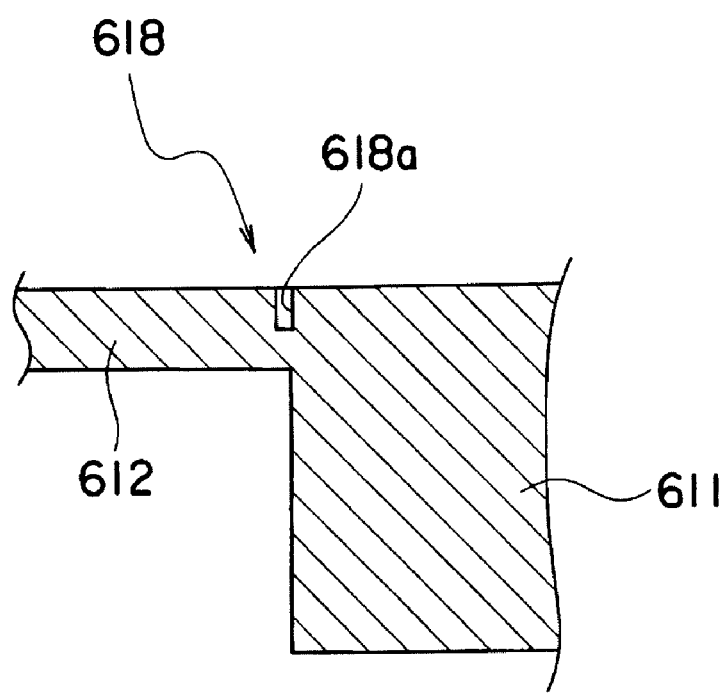
FIG. 12B is XIIB-XIIB of FIG. 12A.

FIG. 12A and FIG. 12B are a plan view and cross-sectional view showing a weakened part in a fifth embodiment of the present invention. The weakened part 618 in the fifth embodiment of the present invention, as shown in FIG. 12A and FIG. 12B, comprises a groove 618a formed in a line shape between the support region 611 and the mark formation region 612 in the base part 61. The weakened part 618 in the present embodiment comprises the groove 618a and therefore becomes relatively weaker in strength compared with other parts of the base part 61.

Note that the number of through holes 615b to 617b is not particularly limited and can be freely set. The shape of the through holes 615b to 617b is also not particularly limited. For example, it may also be made a circular cross-sectional shape. Further, the number of the grooves 618a is also not particularly limited. Two or more grooves 618a may be provided between the support region 611 and a mark formation region 612 in the base part 61.

Returning to FIG. 5 and FIG. 6, the above configured silicon finger contactor 60 is fastened by a binder 51b to the mount base 51. When the probe card 50 faces the wafer under test W, the tips of the contactor 60 face the input/output terminals of the IC device. As the binder 51b, for example, a UV ray curing type binder, a temperature curing type binder, a thermoplastic binder, etc. may be mentioned.

The mount base 51 of the probe card 50 in the present embodiment is a disk shaped board composed of a material having a somewhat larger heat expansion coefficient than the wafer under test W. As the specific material forming this mount base 51, for example, a ceramics, koval, tungsten carbide, stainless invar steel, etc. may be mentioned. Note that, the mount base 51 in the present embodiment corresponds to an example of a board on which a contactor is mounted in the present invention.

As shown in FIG. 2 and FIG. 3, rectangular through holes 51a running through the mount base 51 from the front surface to the back surface are formed behind each contactor 60 in the mount base 51. Bonding wires 52 connected to conductive parts 63 of the contactors 60 are connected via the through holes 51a of the mount base 51 to terminals (not shown) on the circuit board 55.

Figure 14A:
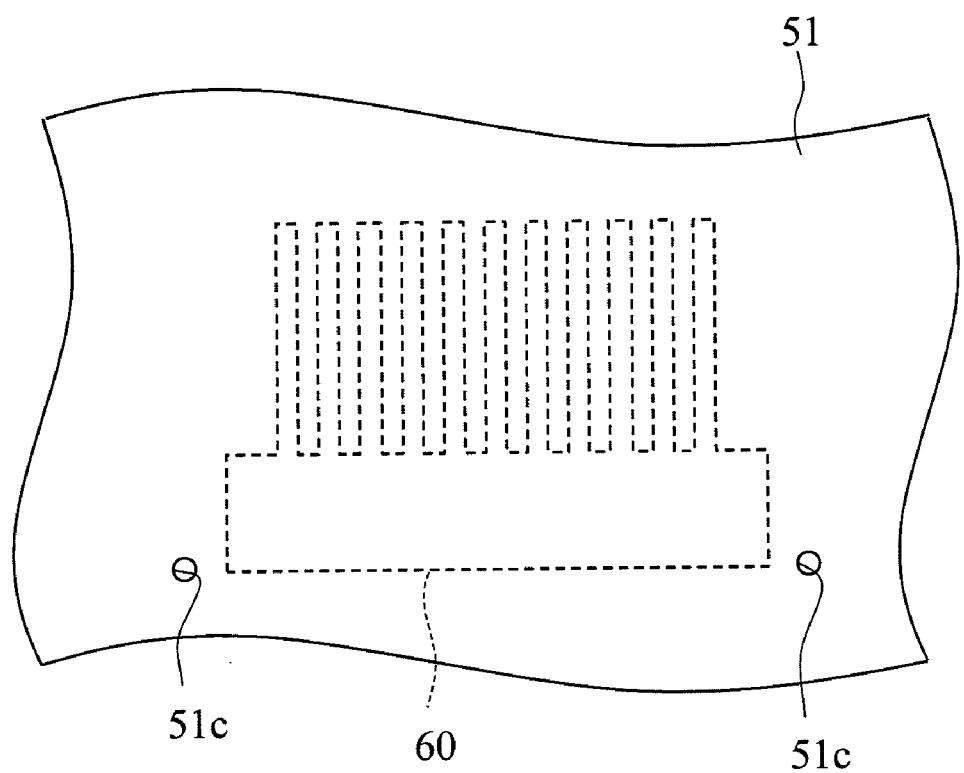
FIG. 14A is a plan view of a board at step S10 of FIG. 13.
Figure 14B:
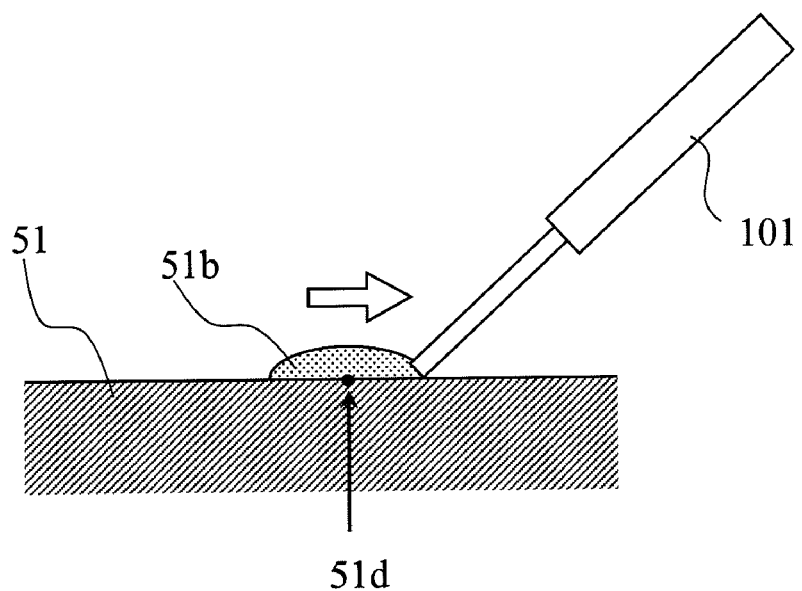
FIG. 14B is a side view of a board at step S20 of FIG. 13.

Further second positioning marks 51c showing the mounting position of the contactor 60 are provided on the front surface of the mount base 51 (see FIG. 14A). The second marks 51c are, for example, comprises through holes or plating layers composed of copper etc.

The circuit board 55 is for example a disk shaped board composed of a glass epoxy resin. Terminals (not shown) to which the bonding wires 52 are connected are provided on the bottom surface of the circuit board 55. Connectors 55c for coupling with connectors 12 of the HIFIX 11 are provided on the top surface of the circuit board 55. Further interconnect patterns (not shown) electrically connecting the terminals on the bottom surface and the connectors 55c on the top surface are formed inside the circuit board 55. As the connectors 55c, for example, LIF (low insertion force) connectors or ZIF (zero insertion force) connectors etc. may be used. Further, the circuit board 55 is formed with first through holes 55a for passing the support columns 53 and second through holes 55b for passing the limiters 54.

A base member 56 and stiffener 57 for reinforcing the probe card 50 are provided on the top surface of the circuit board 55. The base member 56 and the stiffener 57 are fastened together. Further, the stiffener 57 and the circuit board 55 are also fastened at the outer circumferential part of that board 55. As opposed to this, the base member 56 and the circuit board 55 are not directly fastened. For this reason, the circuit board 55 is in an unconstrained state with respect to the stiffener 57 at its center part. Deformation due to heat expansion of the circuit board 55 is therefore not directly transmitted to the base member 56.

The support columns 53 are columnar members for supporting the mount base 51. As shown in FIG. 2, one end of each support column 53 is fixed to the mount base 51, while the other end of the support column 53 is directly fixed to the base member 56 through a first through hole 55a.

The limiters 54 are columnar members for preventing deformation of the mount base 51 when pushing the wafer under test W against the contactors 60. As shown in FIG. 2, one end of each limiter 54 is positioned near the back surface of the mount base 51, while the other end of the limiter 54 is directly fixed to the base member 56 through a second through hole 55b.

The above configured probe card 50, as shown in FIG. 1, is fastened to a ring-shaped holder 70 in a posture so that the contactor 60 faces downwards via the center opening 71. The holder 70 is fastened to a ring-shaped adapter 75 in a state holding the probe card 50. Further, the adapter 75 is fastened to an opening 82 formed at the top plate 81 of the prober 80. This adapter 75 is used for adapting to the opening 82 of the prober 80 a probe card having different size in accordance with the type of the wafer under test W or shape of the test head 10. The HIFIX and the prober 80 are mechanically coupled by mutual engagement of hooks 13 and 76.

The HIFIX 11 is mounted at the bottom of the test head 10. Connectors 12 to which coaxial cables are connected are provided on the bottom surface of this HIFIX 11. By connecting the connectors 12 of the test head 10 side and the connectors 55c of the probe card 50 side, the test head 10 and the probe card 50 are electrically connected. As the connectors 12, in the same way as the connectors 55c of the probe card 50, for example, LIF (low insertion force) connectors, ZIF (zero insertion force) connectors, etc. can be used.

The prober 80 can use a vacuum chuck to hold the wafer under test W and has a conveyor arm 83 enabling this held wafer to be moved. At the time of testing, this conveyor arm 83 faces and pushes the wafer under test W against the probe card 50 approaching inside the prober 80 through the opening 82. In this state, the tester inputs and outputs test signals to an IC device built in that wafer W via the test head 10 so as to test the IC device.

Below, referring to FIG. 13 to FIG. 14G, in the present embodiment, the method of mounting a contactor on the mount base will be explained.

First, at step S10 of FIG. 13, an image processing unit (not shown) of the mounting system recognizes the positions of the two second marks 51c provided on the mount base 51 as shown in FIG. 14A and identifies the position where the contactor 60 should be mounted on the mount base 51 (hereinafter also referred to simply as the "mounting position 51d") on the basis of the positions of the second marks 51c.

Figure 13:
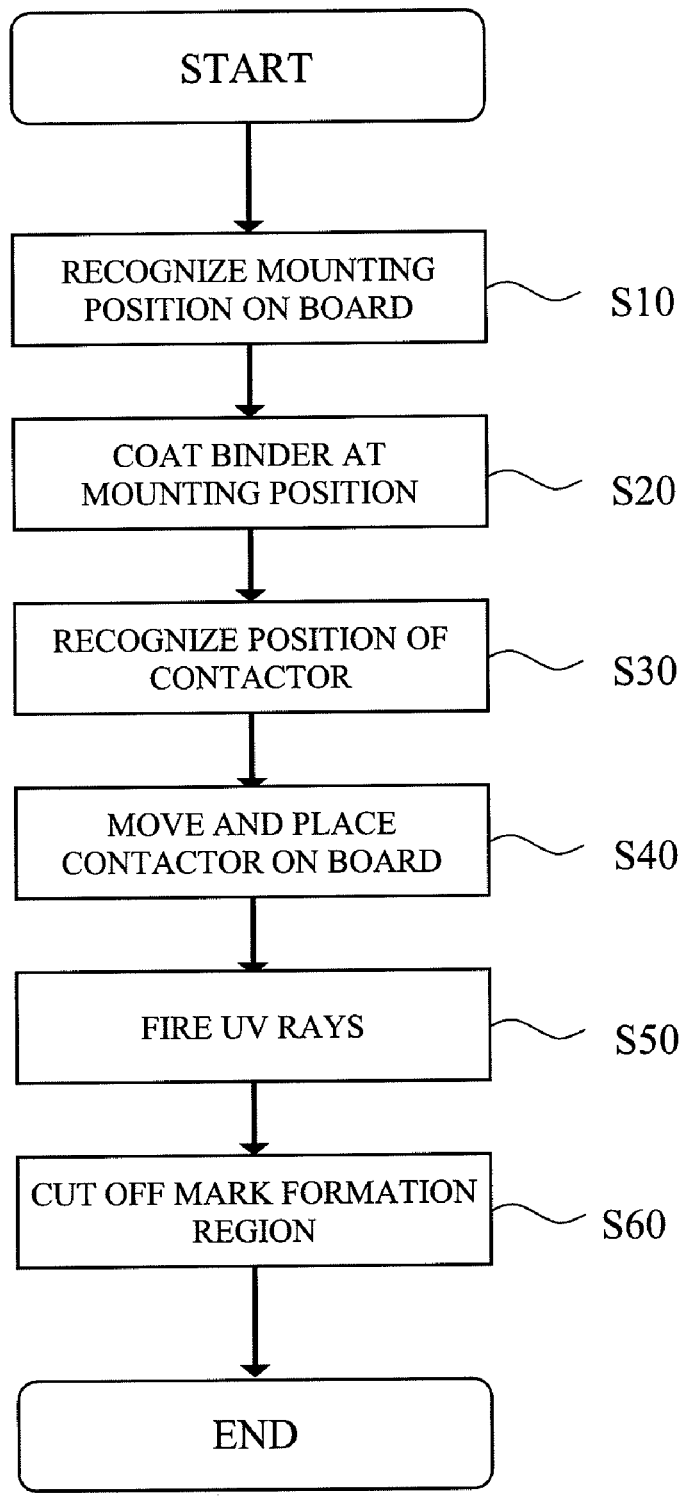
FIG. 13 is a flow chart showing the method of mounting a contactor in a first embodiment of the present invention.

Next, at step S20 of FIG. 13, a coating unit 101 of the mounting system coats a binder 51b on the mounting position 51d of the mount base 51 as shown in FIG. 14A. This coating unit 101 is not particularly illustrated, but for example has a cylinder filled with an UV ray curing type binder and can coat a predetermined amount of binder on the mount base 51.

Next, at step S30 of FIG. 13, a pickup unit 102 of the mounting system (see FIG. 14C) picks up and holds a silicon finger contactor 60. In this state, the image processing unit recognizes the positions of the first marks 613 provided on that contactor 60.

Figure 14C:
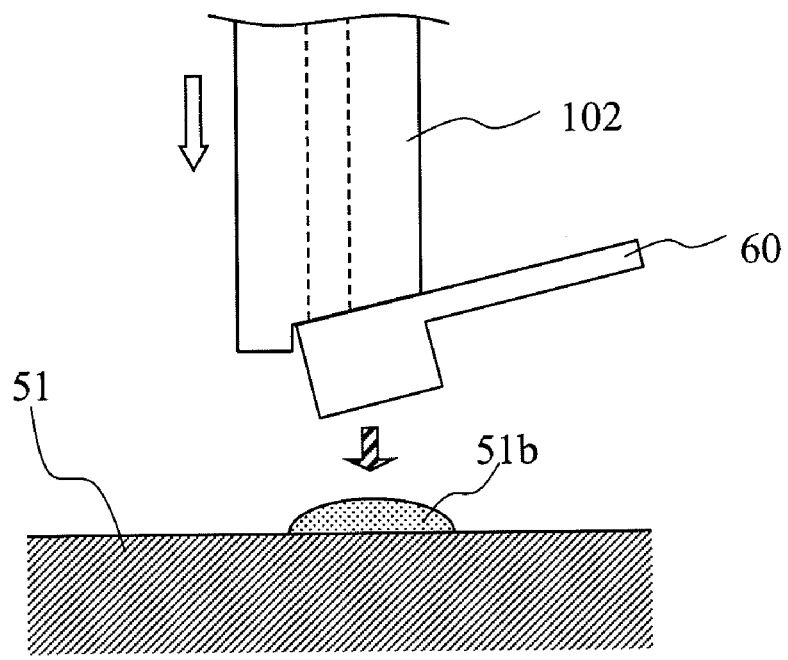
FIG. 14C is a side view of a board at step S40 of FIG. 13.
Figure 14D:
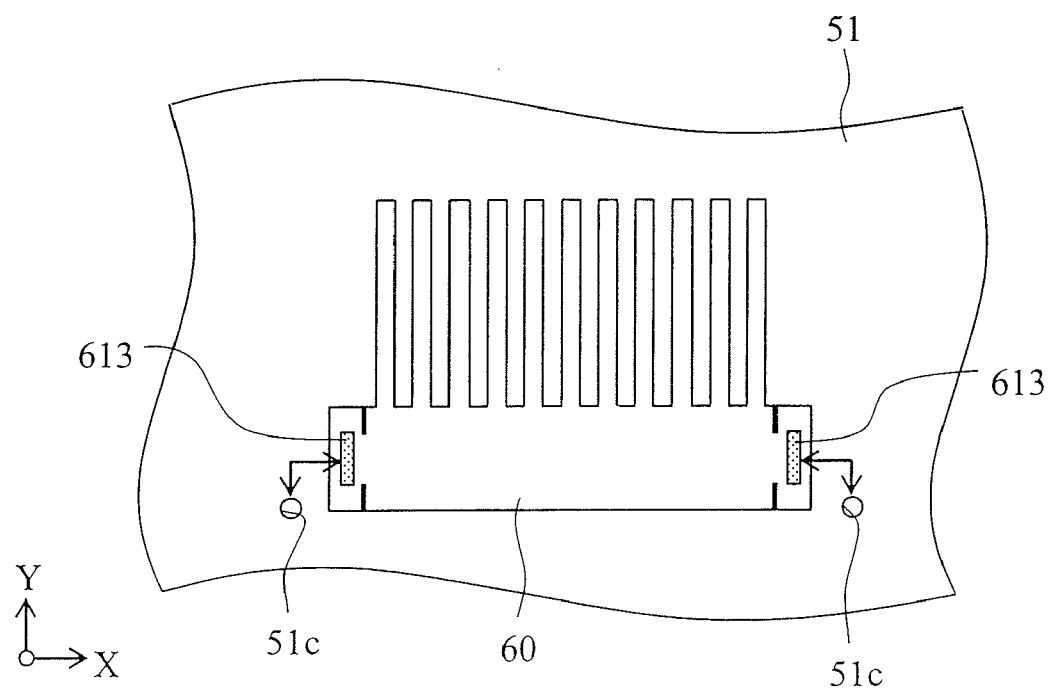
FIG. 14D is a plan view of a board at step S40 of FIG. 13.

Next, at step S40 of FIG. 13, the pickup unit 102 of the mounting system moves the silicon finger contactor 60 toward the mounting position 51d as shown in FIG. 14C. Next, as shown in FIG. 14D, the pickup unit 102 positions the silicon finger contactor 60 with respect to the mount base 51 on the basis of the second marks 51c recognized at the above-mentioned step S10 and the first marks 613 recognized at step S30 and, in this state, places that contactor 60 on the mount base 51. Specifically, as shown in the figure, the contactor 60 is positioned with respect to the mount base 51 so that the first marks 61 are separated from the second marks 51c by predetermined distances in the X-direction and Y-direction.

Figure 14E:
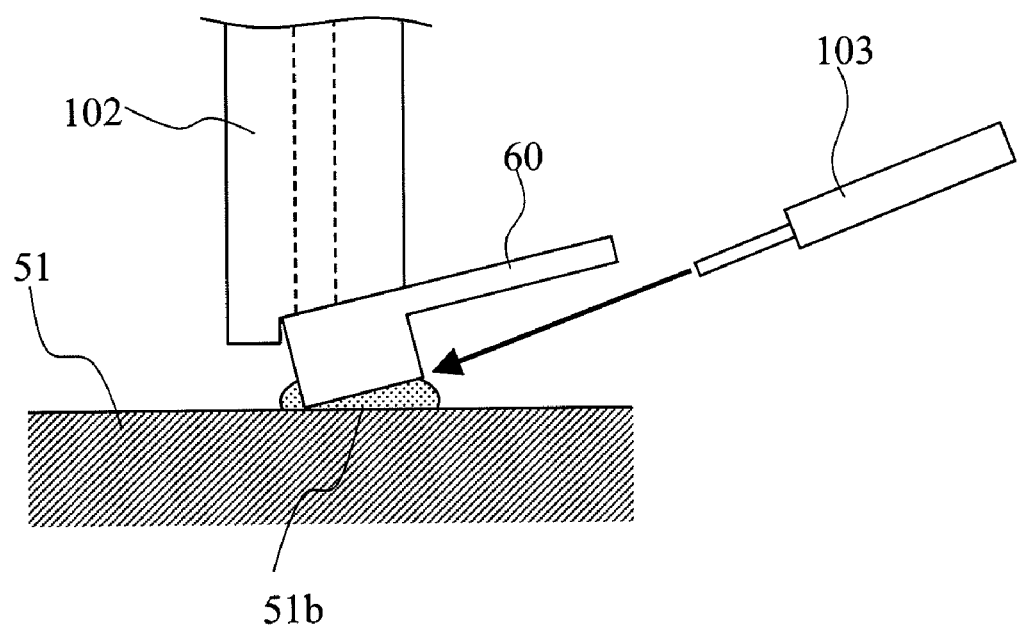
FIG. 14E is a plan view of a board at step S50 of FIG. 13.

Next, at step S50 of FIG. 13, an irradiating unit 103 of the mounting system fires UV rays toward the binder 51b as shown in FIG. 14E. Due to this, the binder 51b cures and the contactor 60 is mounted to the mount base 51.

Figure 14F:
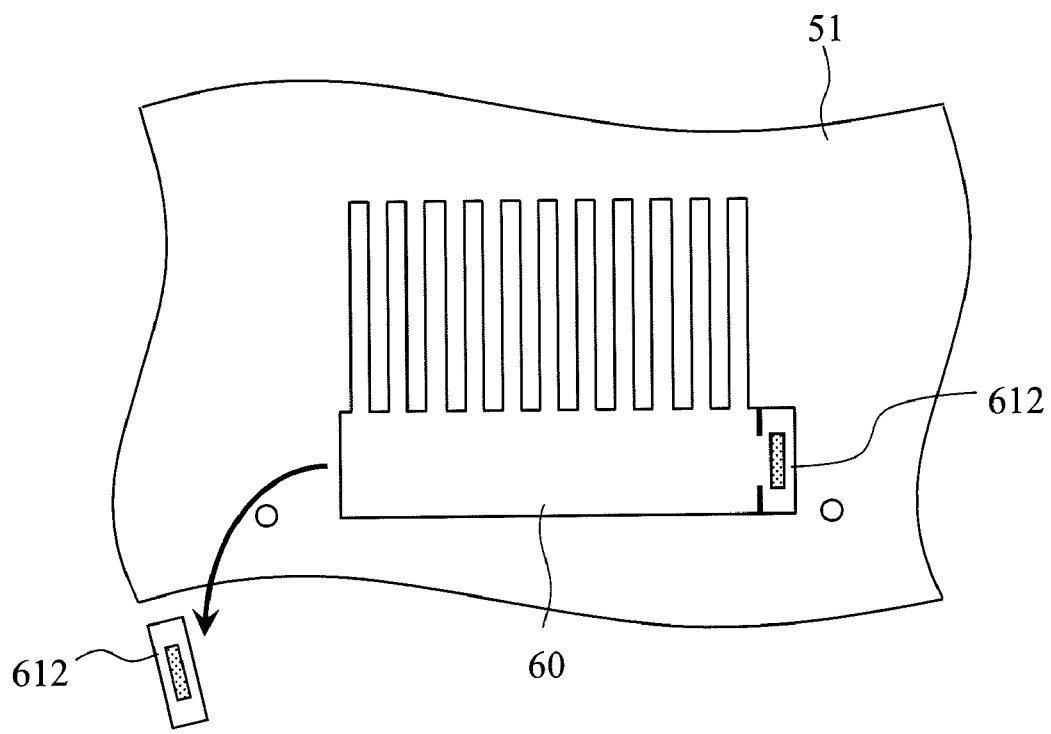
FIG. 14F is a plan view of a board at step S60 of FIG. 13.
Figure 14G:
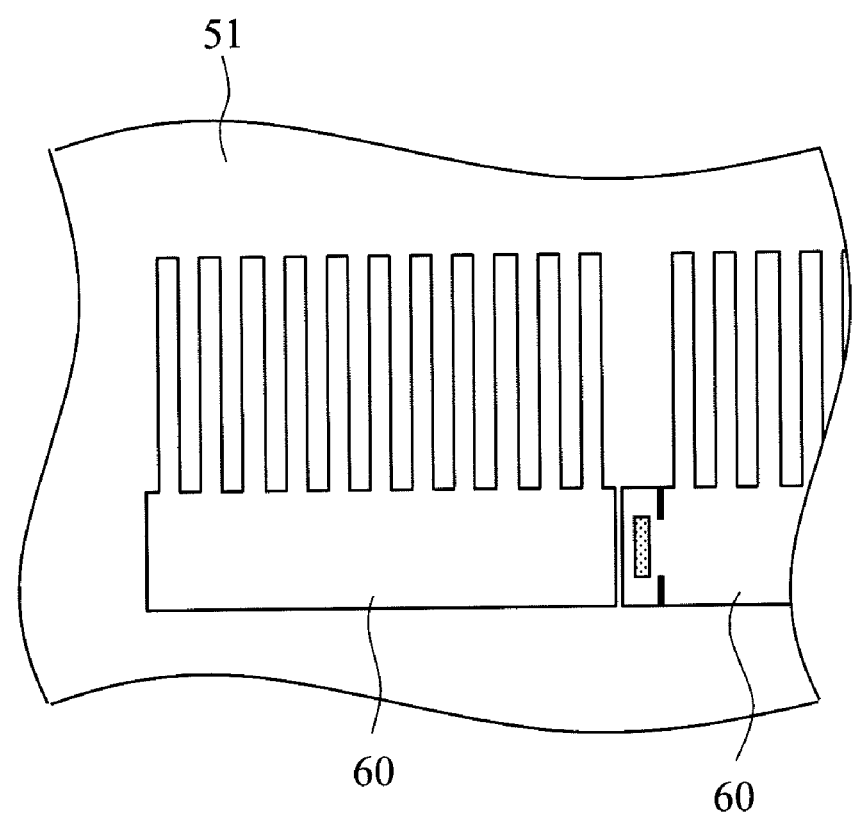
FIG. 14G is a plan view showing the state of arrangement of a next mounted probe adjoining an already mounted probe in a first embodiment of the present invention.

Next, at step S60 of FIG. 13, a pushing unit (not shown) of the mounting system mechanically pushes the mark formation regions 612 provided at the both ends of the silicon finger contactor 60 toward the mount base 51 side as shown in FIG. 14F. Due to this, the mark formation regions 612 at the both ends are cut off from the base part 61 along the weakened parts 613. Note that the mark formation regions 612 may also be cut off from the base part 61 by pushing the base part 61 toward the mount base 51 and pulling the mark formation regions 612 toward the opposite direction from the mount base 51.

In the above way, in the present embodiment, the mark formation regions 612 not contributing to improvement of the mounting density are removed from the contactor 60 after mounting a silicon finger contactor 60 on the mount base 51. Due to this, as shown in FIG. 14G, when arranging silicon finger contactors 60 adjoining each other on the mount base 51, it is possible to close up the spaces between contactors 60 by the amount of one mark formation region 612 each and thereby improve the mounting density of beam parts 62 on the probe card 50.

Note that, the embodiments explained above were described for facilitating understanding of the present invention and were not described for limiting the present invention. Therefore, the elements disclosed in the above embodiments include all design changes and equivalents falling under the technical scope of the present invention.

The invention claimed is:

1. A contactor for contacting an input/output terminal of a device under test for establishing electrical connection between the device under test and an electronic device test system when testing the device under test, the contactor comprising:
   a conductor part for electrical connection with the input/output terminal of the device under test;
   a beam part with the conductive part provided on its main surface; and
   a base part supporting the beam part in a cantilever manner, wherein
   the base part has:
   a support region supporting the beam part;

a mark formation region where a first positioning mark is provided, and a weakened part relatively weaker in strength than other parts of the base part provided between the support region and the mark formation region, wherein the base part supports a plurality of the beam parts aligned substantially in parallel all together, the base part has a second mark formation region, and the mark formation region and the second mark formation region are arranged at both ends of the support region in the base part along a direction of arrangement of the plurality of beam parts.

2. The contactor as set forth in claim 1, wherein the weakened part includes a notch, a groove, or a plurality of through holes provided between the support region and the mark formation region.

3. The contactor as set forth in claim 1, wherein the mark formation region is relatively thinner than the support region in the base part.

4. The contactor as set forth in claim 1, wherein the weakened part is provided along a direction substantially perpendicular to the direction of arrangement of the plurality of beam parts.

5. A probe card for establishing electrical connection between a device under test and an electronic device test system when testing the device under test, the probe card comprising:

the contactor as set forth in claim 1; and a board on which the contactor is mounted, wherein the mark formation region is configured to be cut off from the base part along the weakened part.

6. A method of mounting of the contactor as set forth in claim 1, the method of mounting of the contactor comprising:

mounting the contactor on a board; and cutting off the mark formation region from the base part.

7. The method of mounting of the contactor as set forth in claim 6, wherein the mark formation region is pushed or pulled so as to cut off the mark formation region from the base part.

8. The method of mounting of the contactor as set forth in claim 6, wherein mounting includes:

positioning the contactor relative to the board on the basis of a second mark formed on the board and the first mark formed on the mark formation region; and fastening the conductor to the board.

9. The method of mounting of a contactor as set forth in claim 6, further comprising etching a silicon layer of the base part by a DRIE (deep reactive ion etching) method so as to form the weakened part on the contactor.

* * * * *